United States Patent [19]

Auvinen et al.

[11] Patent Number: 5,276,833
[45] Date of Patent: Jan. 4, 1994

[54] DATA CACHE MANAGEMENT SYSTEM WITH TEST MODE USING INDEX REGISTERS AND CAS DISABLE AND POSTED WRITE DISABLE

[75] Inventors: Stuart T. Auvinen, Santa Cruz; William H. Nale, Livermore, both of Calif.

[73] Assignee: Chips and Technologies, Inc., San Jose, Calif.

[21] Appl. No.: 544,821

[22] Filed: Jul. 2, 1990

[51] Int. Cl.⁵ .............................. G06F 11/22
[52] U.S. Cl. ................. 395/425; 364/DIG. 1; 371/21.1; 371/21.6; 395/400
[58] Field of Search ............ 364MS/200MS, 900MS; 395/400, 425; 371/21.1, 21.6

[56] References Cited

U.S. PATENT DOCUMENTS

| | | | |
|---|---|---|---|
| 4,788,684 | 11/1988 | Kawaguchi et al. | 371/21.6 |
| 4,794,523 | 12/1988 | Adan et al. | 395/250 |
| 4,907,189 | 3/1990 | Branson et al. | 395/425 |
| 4,953,073 | 8/1990 | Moussouris et al. | 395/400 |
| 4,959,777 | 9/1990 | Holman, Jr. | 395/325 |
| 4,980,888 | 12/1990 | Bruce et al. | 371/21.1 |
| 5,025,366 | 6/1991 | Baror | 395/425 |
| 5,072,450 | 12/1991 | Helm et al. | 371/21.6 |
| 5,073,891 | 12/1991 | Patel | 371/21.3 |
| 5,113,506 | 5/1992 | Moussouris et al. | 395/400 |
| 5,195,096 | 3/1993 | Moore | 371/21.1 |

*Primary Examiner*—Joseph L. Dixon
*Assistant Examiner*—Hiep T. Nguyen
*Attorney, Agent, or Firm*—Townsend and Townsend Khourie and Crew

[57] ABSTRACT

A memory controller which can be used with an external tag RAM is disclosed. Existing index registers in the controller serve double duty as buffers for storing tag RAM data during a test mode. Input/output lines for the external tag RAM are coupled to the index registers in addition to being coupled to a comparator for comparison with an external address during normal operation. A buffer is provided so that data from the external address from the CPU can be written through these same tag RAM input/output lines in order to update the tag RAM after a miss. In order to prevent DRAMS from putting data on the memory bus during a cache RAM test, a CAS inhibit signal is provided to the DRAM state machine. Posted writes are also disabled to avoid interference with the address provided to the tag RAM.

5 Claims, 4 Drawing Sheets

DATA CACHE MANAGEMENT SYSTEM WITH TEST MODE USING INDEX REGISTERS AND CAS DISABLE AND POSTED WRITE DISABLE

BACKGROUND OF THE INVENTION

The present invention relates generally to data caches, and more specifically to techniques for controlling, configuring, and testing such caches.

The use of a data cache is well known as a technique for overcoming some of the performance limitations that result from the mismatch between processor speed and main memory access time. This tends to be a problem with very fast CPU's. In brief, the technique entails providing a relatively small cache memory characterized by access times significantly less than that of the main memory. The contents of selected portions of main memory are copied into the cache memory, and memory accesses look to the cache to speed the data acquisition. In current high-end personal computers, the main memory is implemented as DRAM (dynamic RAM) chips, while the cache data RAM and tag RAM are implemented as SRAM (static RAM) chips which are much faster, but much more expensive for a given amount of memory.

A typical direct-mapped cache includes a cache data RAM containing cached data, and a tag RAM containing partial (high-order) address information. The cache is accessed by applying low-order address information as an index to the address inputs of the cache data RAM and the tag RAM, reading out the tag, and comparing the tag with the corresponding portion of the full address. If the two agree, the access is said to have resulted in a cache hit, and the contents of the cache data RAM for that address are supplied to the CPU. If the two do not agree, the memory access is said to have resulted in a cache miss, and the CPU must wait for the data to be brought in from the slower main memory.

As a specific example, a 64-kilobyte cache is addressable by a 16-bit address. An 8-bit tag, when combined with the 16-bit address, provides a 24-bit address which allows any memory location in a 16-megabyte memory to be cached. A 10-bit tag would allow caching of up to a 64-megabyte memory. In a typical configuration, the cache data RAM data ports are coupled to the local processor bus while the DRAM data ports are coupled to a buffered version of the local processor data bus. Buffers and separate control signals are needed to avoid both the DRAM and the cache trying to put data on the bus at the same time.

A typical cache memory will have valid bits associated with each entry. The valid bits indicate whether there is a valid entry in the cache. Invalid entries will be present, for example, when the system is started up before there have been any reads from the DRAM to put data into the cache. In addition, if the data in DRAM is modified, the corresponding cache entry for the previous data will become invalid.

SUMMARY OF THE INVENTION

The present invention provides a memory controller which can be used with an external tag RAM. Existing index registers in the controller serve as buffers for storing tag RAM data during a test mode. Input/output lines for the external tag RAM are coupled to the index registers for use in a test mode, in addition to being coupled to a comparator for comparison with an external address from the CPU during normal operation. A buffer is provided so that data from the external address can be written through these same tag RAM input/output lines in order to update the tag RAM after a miss.

The DRAM state machine is used to provide the basic timing signals for the cache RAM in addition to the timing signals for the DRAMs. In order to prevent the DRAMs from putting data on the memory data bus during a cache RAM test, a CAS inhibit signal is provided to the DRAM state machine. This avoids the need for additional circuitry to duplicate the DRAM state machine timing functions for testing the cache RAM, while at the same time avoiding interference between DRAM data and cache RAM data during the test mode.

The present invention also provides an external tag RAM which does not use valid bits. This is accomplished using a special test initialization mode in which the entire cache is loaded with valid data before being used.

A new test mode for the tag RAM loads the data from the tag RAM to the index registers during a first cycle, and then in a second cycle provides the contents of the index register to the external processor for comparison. This avoids the need for external buffers, thus limiting the amount of circuitry as well as preventing the tag RAM I/O lines from being loaded down by the additional circuitry. This improves the speed of the tag RAM during normal operation. The trade off is that two cycles are required during the test mode for a read, rather than one. However, this penalty is only paid during test, and not normal operation.

A further understanding of the nature and advantages of the present invention may be realized by reference to the remaining portions of the specification and the attached drawings.

BRIEF OF THE DRAWINGS

DESCRIPTION OF SPECIFIC EMBODIMENTS

System Overview

Figure 1:
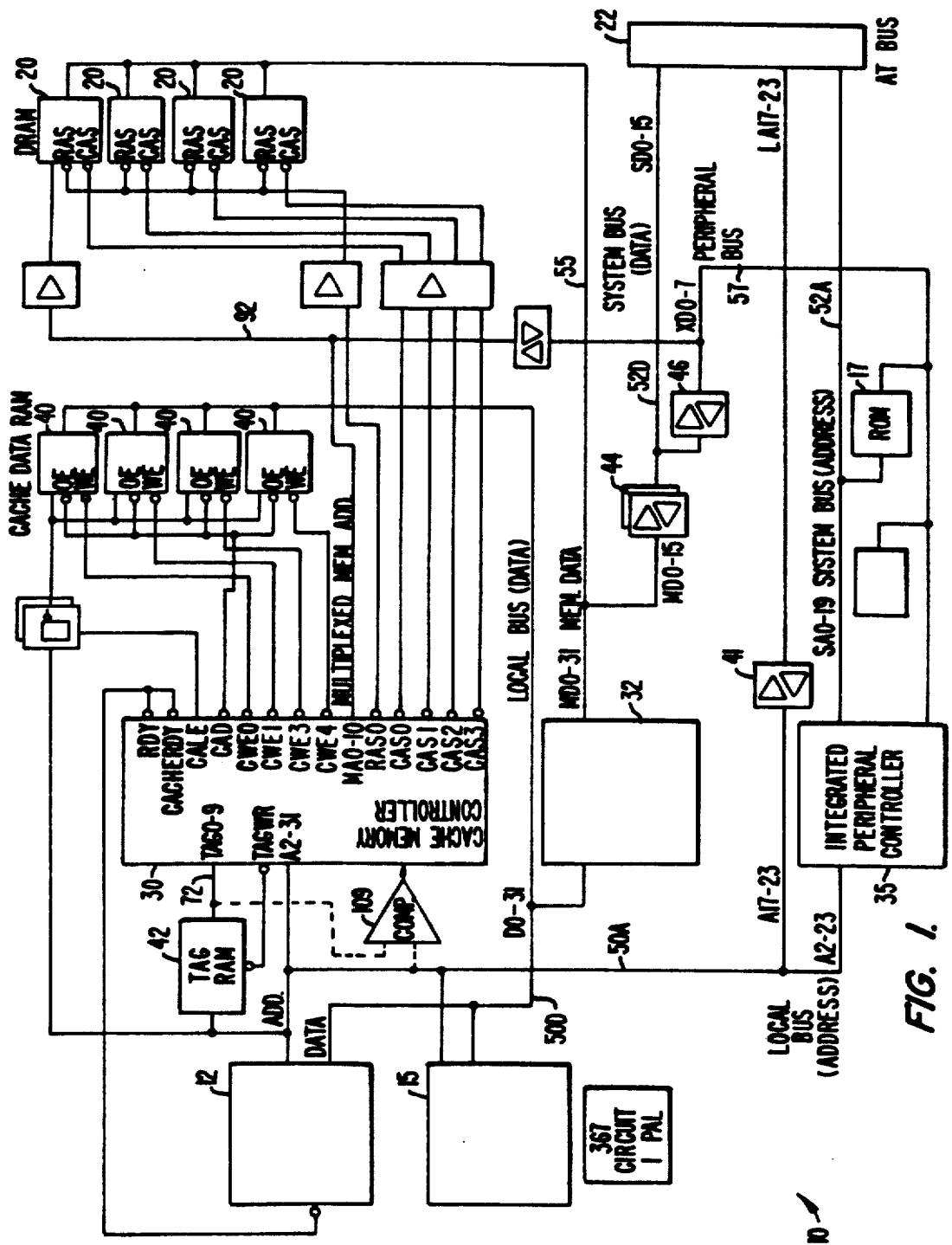
FIG. 1 is a block diagram of a system incorporating the present invention.

FIG. 1 is a block diagram of a high-end personal computer system 10. The system may be referred to as a 386-based AT system in that it incorporates the standard AT bus structure and is built around an Intel 80386 microprocessor 12 (with an optional 80387 numeric co-processor 15). The basic system elements further include system and program memory implemented as a read-only memory (ROM) 17 and random access memory (RAM) implemented as a number of dynamic random access memory (DRAM) chips 20 and an I/O channel 22. The I/O channel provides slots on the bus into which are plugged cards for such devices as a video controller, hard disk controller, floppy disk controller, network card, or CD-ROM controller.

The logic support chip set includes a cache/memory controller chip 30, a data path controller chip 32, and an integrated peripheral controller (IPC) chip 35. The IPC chip includes a DMA controller, timers, interrupt controllers, real time clock, and address buffers.

As will be described in greater detail below, memory/cache controller chip 30 provides addresses for DRAM 20 and a cache data RAM comprising a number of static random access memory (SRAM) chips 40. Associated with cache data RAM 40 is a tag RAM 42 (also implemented as an SRAM chip).

Communication between various devices is established on a number of buses, including a local bus 50 (local data bus 50D and local address bus 50A), a system bus (S-Bus) 52 (system data bus 52D and system address bus 52A), a memory data bus (M-Bus) 55, and a peripheral bus (X-Bus) 57. Local bus 50 includes a 32-bit address portion A(0-31) and a 32-bit data portion D(0-31). The local bus 50 provides communication between microprocessor 12 and co-processor 15. Portions of the local address bus are communicated to cache memory controller chip 30, to tag RAM 42, and to IPC controller chip 35. A buffered version (through buffer 41) of A(17-23) defines a portion of the AT bus. The local data bus 50D communicates with cache data RAM 40 and a buffered version (through data path controller 32) defines the MD-Bus 55.

S-Bus 52 includes a 20-bit address portion SA(0-19) that is a buffered and latched version (through integrated peripheral controller 35) of A(2-23) of local bus 50A and a 16-bit data portion SD(0-15) which is a buffered version (through buffer 44) of MD(0-15) of memory data bus 55. X-Bus 57 includes an 8-bit data portion XD(0-7) which is a buffered version (through buffer 46) of SD(0-7).

An optional external comparator 109 is shown with dotted line inputs from tag RAM I/O 72 and local address bus 50A. The output is provided to cache/memory controller 30.

Figure 2:
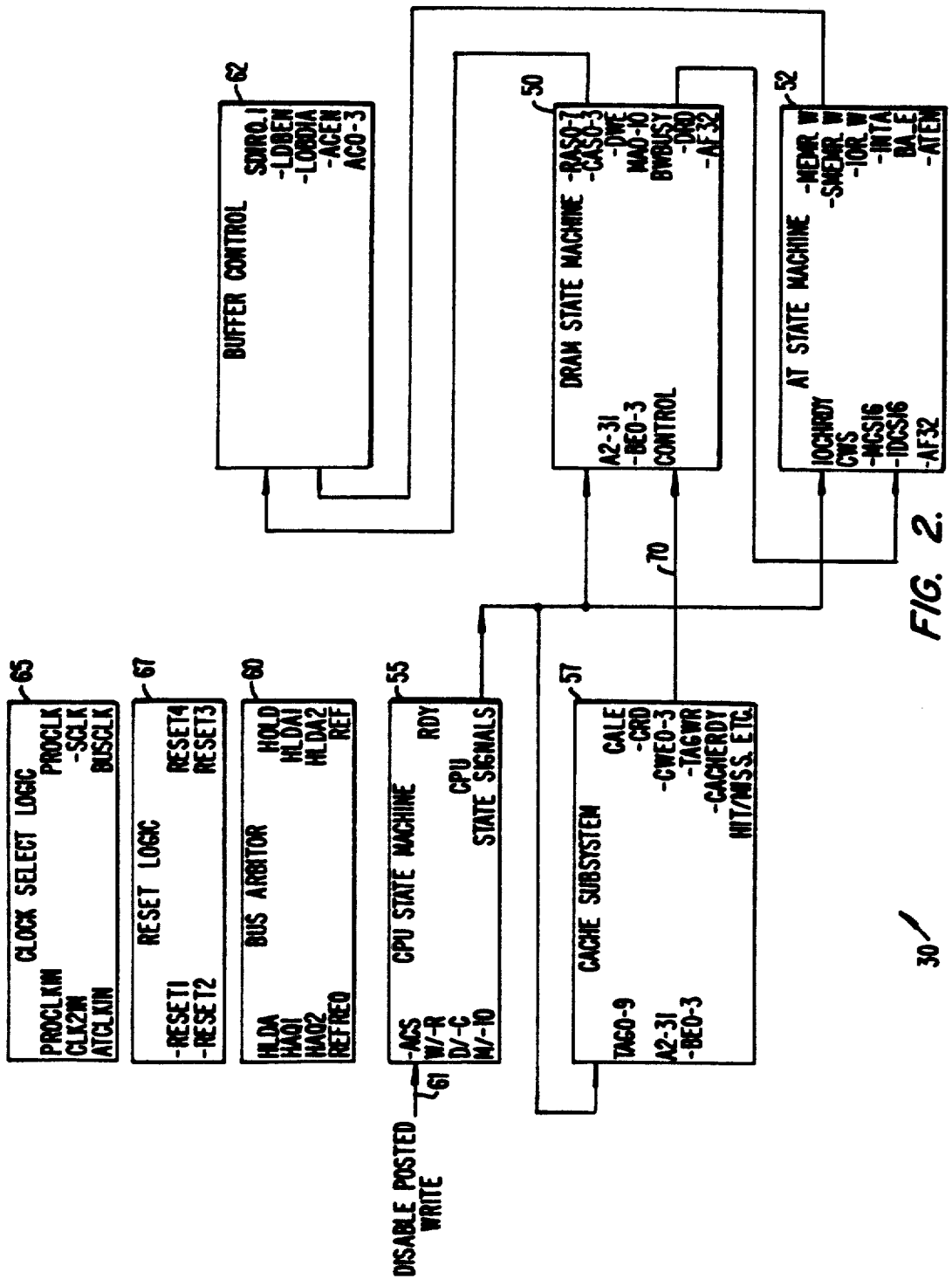
FIG. 2 is a block diagram of the memory/cache controller chip of FIG. 1.

FIG. 2 is a block diagram of cache/memory controller chip 30. Chip 30, in addition to controlling the memory and cache, includes a number of state machines and sub-systems that provide other logic support, as will be described briefly below. The lines interconnecting the blocks are on-chip connections, while the labelled signals on the blocks are connected to I/O pins of the chip 30.

A DRAM state machine 50 responds to address information (A2-31), which it decodes to see if the address maps to the DRAM. To the extent that the address sought does, the DRAM state machine provides a number of timed address signals including row address strobes RAS(0-7), column address strobes CAS(0-3), and multiplexed memory address signals MA(0-10).

An AT state machine 52 handles all cycles that are not taken by the DRAM state machine or by another master asserting an external AF32 signal. A CPU state machine 55 tracks the state of the CPU and communicates this to other state machines in the system.

A cache controller subsystem 57 operates to determine whether a currently accessed memory location has an image in the cache, and, if so, provides signals to the state machines indicating that it has taken care of the cycle. In the case of a cache hit, the DRAM state machine 50 remains dormant in response to a signal on line 70.

A bus arbiter 60 determines which unit in the system is to be bus master. In general, there is only one master at a time, which could be the CPU, the DMA controller, a device plugged into one of the connectors on I/O channel 22, or a refresh controller.

Buffer control circuitry 62 controls the direction of the buffers between the MD-bus and the SD-bus, and further provides a number of control signals to data path controller chip 32. Chip 32 includes a swapper circuit that allows data on the high order byte of the SD-bus to be put on the low-order byte or vice versa, to permit communication between 8-bit devices on the XD-bus and either the high-order or low-order byte on the SD-bus.

Chip 30 also contains clock select logic 65 and reset logic 67. The clock select logic is responsible for setting the AT-bus speed (normally 8 MHz), based either on an external oscillator or generated as a sub-multiple of the processor clock. The reset logic provides CPU and system reset signals, and responds to a power up signal which causes both the CPU and the system to be reset and to specific keyboard signals which causes the CPU to be reset.

Figure 3:
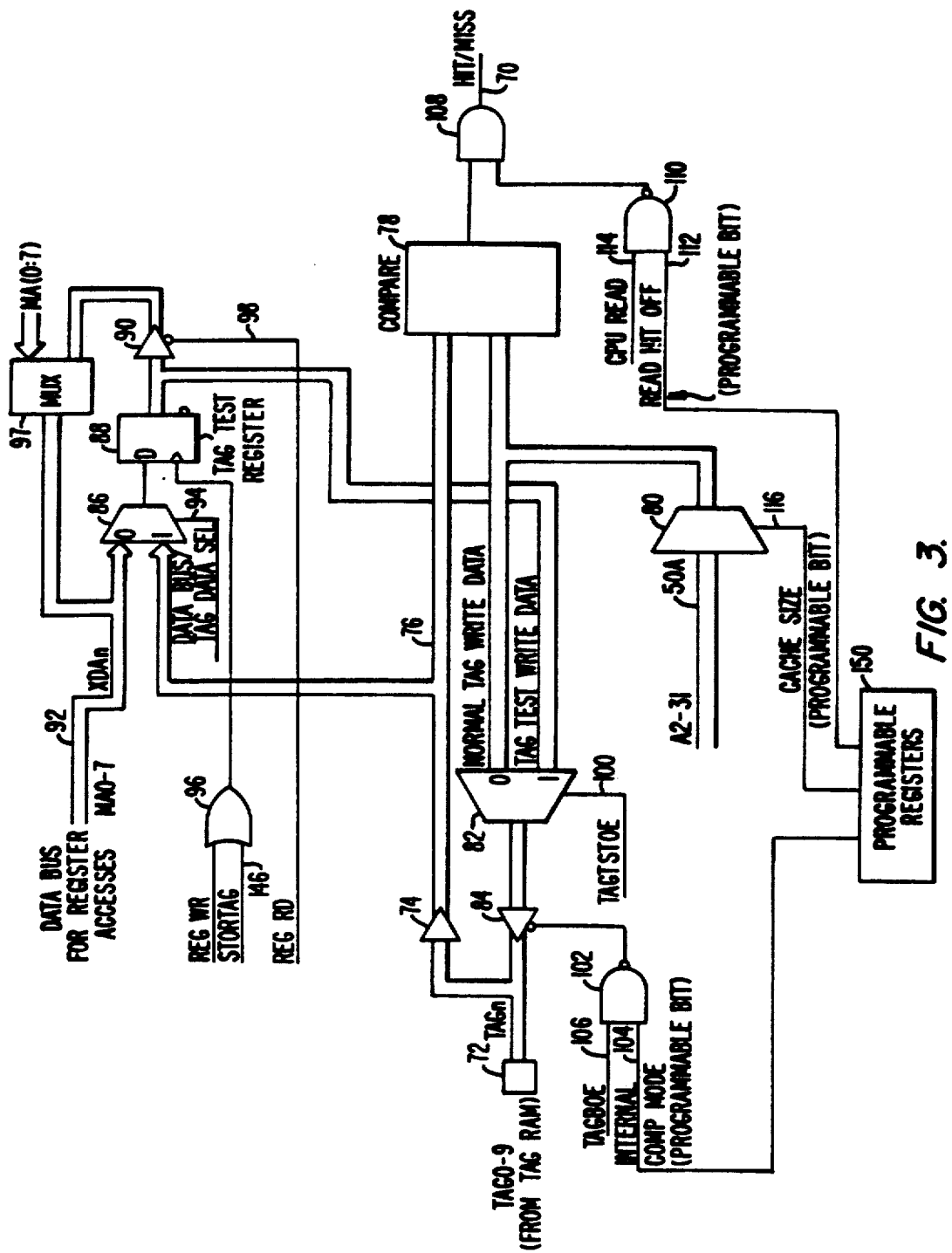
FIG. 3 is a diagram of the tag RAM data paths in the cache controller of FIG. 1.

FIG. 3 is a diagram of a portion of the logic circuitry of cache subsystem 57 of FIG. 2. (Some of the signals shown are shown in DRAM state machine 50 of FIG. 2 since the actual circuits are intermixed.) The tag RAM I/O lines 72 are provided as an input through a buffer 74 along a bus 76 to a comparator 78. The comparator receives as another input address bits from local address bus 50A through a multiplexer 80.

In the case of a write to the tag RAM after a cache miss, the tag is provided through multiplexer 80 and a second multiplexer 82 and a buffer 84 to I/O lines 72. During a test mode "read" operation, instead of the tag data being provided to comparator 78, it is provided on line 76 through a multiplexer 86 to an index register 88. After storing the tag in register 88 in the first cycle, a second cycle has the data read out through a buffer 90 and multiplexer 97 to data bus 92. This corresponds to pins MA(0:7) of DRAM machine 50 shown in FIG. 2. During normal index register use, the other input of multiplexer 86 is used to provide an input to index register 88 under the control of the data bus/tag data select line 94. Index register 88 is clocked by either a register write signal or a store tag signal 146 from the DRAM state machine 50 through an OR gate 96.

A number of control signals are used to control the operation of the circuit of FIG. 3. A register read signal on a line 98 allows the reading of index register 88 by enabling the output of buffer 90. A signal on line 100, also from DRAM state machine 50, controls the selection of multiplexer 82 to provide either normal tag write data or tag test write data to the tag RAM. The tag test write data is provided from the output of index register 88. During a test of the tag RAM, the data is written into index register 88 along path 92. In a subsequent cycle, the index register contents are provided to the tag RAM through multiplexer 82 and buffer 84. By using this internal path, the need for a separate, external path to the tag RAM is eliminated, thereby eliminating additional loading down of the tag RAM I/O lines.

Buffer 84 is enabled by a select signal from a NAND gate 102. One input to NAND gate 102 is an internal compare mode programmable bit line 104 from programmable registers 150. This bit will disable the output of the buffer when the internal comparator 78 is disabled. The other input signal 106 is used to enable buffer 84 during normal read miss updating of the tag RAM or test mode writes. Signal 106 is generated from the DRAM state machine 50.

Hit/miss output line 70 from comparator 78 is provided through an AND gate 108 so that it can be gated by the output of a NAND gate 110. NAND gate 110 has one input 112 which can be programmed to disable the hit output on read cycles and has another input 114 which is used to distinguish between reads and writes from the CPU.

Write hits are not disabled to maintain cache consistency. This scheme uses a write-through cache which always writes to the DRAM at the same time as writing to the cache.

A cache size select input 116 controls multiplexer 80 to determine which address bits will be compared in comparator 78. The number of bits will correspond to the length and width of the actual cache used.

Figure 4:
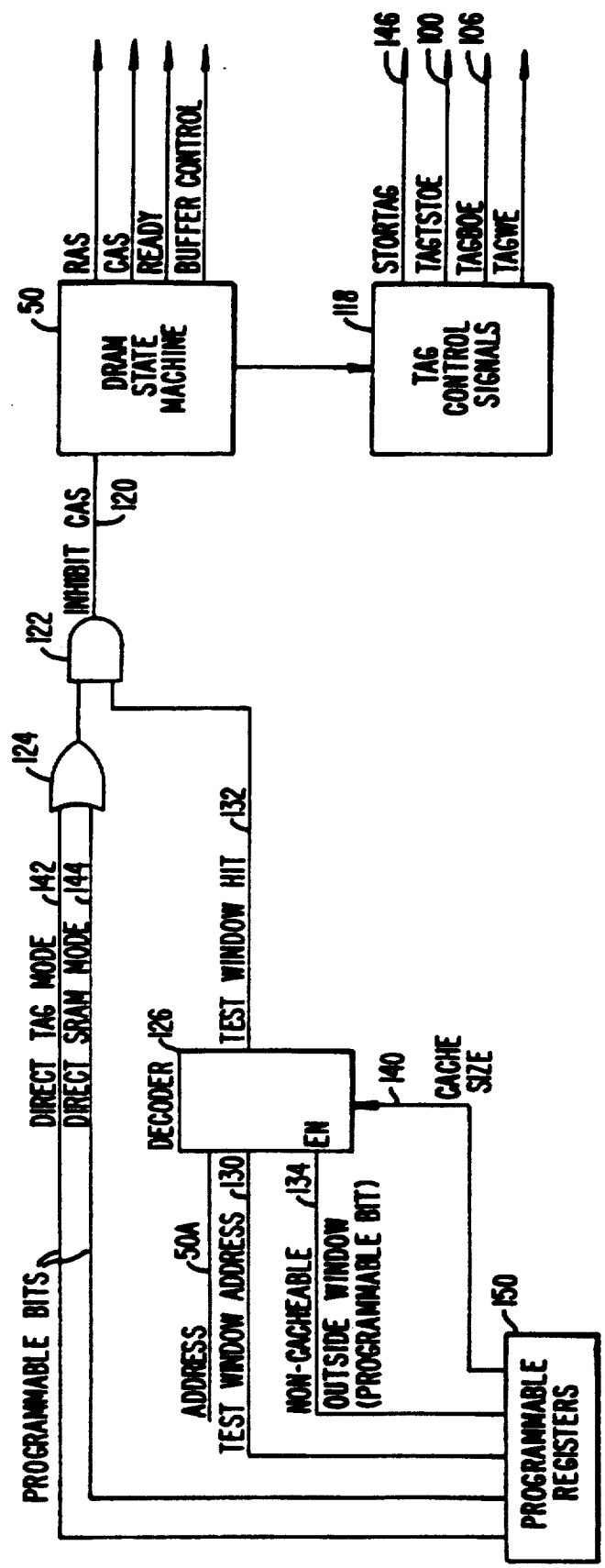
FIG. 4 is a diagram of the CAS inhibit circuitry of the cache controller of FIG. 1.

FIG. 4 shows the circuitry for piggy-backing on DRAM state machine 50 to provide the necessary tag RAM control signals. Tag control signal logic block 118 provides various control signals to the tag RAM. These control signals include a tag output enable signal 106, a tag store output enable signal 100 and a tag store signal 146. These control signals are generated in accordance with the timing provided by DRAM state machine 50. When a cache test mode access is done, the DRAM state machine is prevented from accessing the DRAM by an inhibit CAS signal 120. This signal is provided from an AND gate 122. A first input of AND gate 122 is provided through an OR gate 124. Either of two programmable bits will enable this input, the first bit being the direct tag mode for testing the tag SRAM 42 and the second being the direct SRAM mode for testing the data SRAM 40. The other input of AND gate 122 is provided from an output of a decoder 126. Decoder 126 takes an address from the CPU on lines 50A and compares it to a pre-programmed test window address on lines 130. If the address provided is within the test window, a test window hit signal is generated on a line 132. Decoder 126 must be enabled by an input 134 which is a programmable bit to indicate that areas outside the test window are non-cacheable.

The test window in the memory map whose address appears on lines 130 is defined by a programmable register. This window is the same size as the cache size on line 140. Both data and tag SRAMs use the same window and the same decoder logic. The non-cacheable areas in memory are defined by the programmable registers on the chip. Memory outside of the test window must be non-cacheable so that SRAM cycles will not occur before the SRAM is tested. All areas outside the test window could be made automatically non-cacheable in test modes by programming line 134. Areas outside the test window are made non-cacheable to avoid interference from another source (i.e., DMA controller) during the running of a test program.

The present invention also supports the use of an external comparator (comparator 109 of FIG. 1) rather than the internal comparator 78 of FIG. 3. The internal comparator saves extra chips, but does not allow upgrading when there are speed improvements in external comparators. When external comparators are used, timing control signals for the external buffers are generated using tag I/O lines 72. These lines are connected to control the inputs to comparator 109, by enabling appropriate external buffers (not shown), rather than to the tag RAM when an external comparison is done. The control signals for the buffers are provided by appropriately programming index registers inside chip 30. The hit/miss signal, 70, is now an I/O to chip 30 using tag I/O lines 72. The hit/miss signal is generated from the external comparator.

A dedicated ready pin is used for cache read hits to improve speed. The regular ready pin pulls ready back to a 1 after the cycle is over so that the cache ready pin doesn't have to have attached circuitry to pull up the ready line. This simplifies the cache ready path and makes it faster.

When doing a test of the tag RAM, posted writes need to be turned off. The posted write capability is provided in CPU state machine 55 of FIG. 2. A posted write is a write to DRAM from the CPU which can occur concurrent with the following CPU access if the following access is a read from the cache. The address is stored in chip 30 while the data is stored in chip 32 (see FIG. 1). A ready signal is returned to the CPU before the DRAM has been written, allowing the CPU to place a new address on local address bus 50A and request another cycle. If the request is for data in the cache, data is returned from cache data chips 40 and ready is returned. Otherwise, the CPU must wait for the DRAM write to continue. Because the address on local address bus 50A can change following the early ready of a posted write, and the local address bus is tied to the cache RAMs 40 and 42, the posted write would cause the wrong address to appear to the SRAMS during tag or SRAM test modes. Therefore, posted writes must be disabled for testing. A programmable bit, 61 in FIG. 2, causes CPU state machine 55 to not generate the early ready for posted writes.

Cache Tag RAM Testing

The sequence to test tag RAM is as follows:
1. The cache should be disabled.
2. Set up the test window address (130) to an area which will only be accessed by the test software (no code fetches, stack, or interrupts). Enable the test window, 134.
3. Turn off posted writes. They will interfere with the test by changing the tag address.
4. Program the chip for internal or external comparator, as appropriate.
5. Enable tag RAM test mode, line 142.
6. Test the tag RAM by accessing the test window. For internal comparator, register 88 must be accessed to place and get the data.
7. Turn off tag RAM test mode, line 142.
8. Turn on posted writes, if desired.

This routine is contained in ROM 17.

Cache Data RAM Testing

The data RAM is tested using the same testing window. This window is an area in the memory map below 1 MEG, which is the same size as the cache data RAM. The address of the window is specified by address lines 130, which specify address bits A19-15. For a 64K cache A15 is not included in the decode, and so on for larger sizes.

Testing the data RAM is done with the following sequence:
1. The tag RAM should have been tested first because the tag RAM is used to test the data SRAM.
2. Program the test window select bit lines 130.
3. Set the "Cache Test Window" bit 134 to a 1 making all areas other than the test window non-cacheable.
4. Set the RDHITOFF bit 112 to a 1 to force all reads to be misses.
5. Set the CACHEN bit to a 1 to enable the cache.
6. Read every memory location in the test window. This makes all of the tag entries point to the test window. All other accesses are non-cacheable and will not modify the tag RAM.

7. Set the RDHITOFF bit 112 to a 0.
8. Turn on the DIRECT SRAM enable bit 144.

This withholds CAS through line 120 during accesses to the test window.

9. Test the data SRAM through the test window. All accesses other than to the test window are non-cacheable (because of step #3). All accesses to the test window should now be cache hits because step 6 loaded the tag RAM with the addresses inside the test windows. If they are not due to some problem, the DRAM state machine 50 will run, but there will be no CAS. The data should read as FFs, the default value of a floating memory data bus 55, because the DRAMS 20 will not drive data onto bus 55. This error can be detected by the software routine in the ROM 17.
10. Turn off the DIRECT SRAM enable bit 144.
11. Do a flush by reading every memory location in the cache test window with RDHITOFF, line 112, set to 1 before enabling the cache since the SRAM and DRAM do not contain the same data.
12. Turn off the Cache Test Window bit 134.

Conclusion

While the above is a complete description of the preferred embodiments of the invention, various alternatives, modifications, and equivalents may be used. Therefore, the above description should not be taken as limiting the scope of the invention which is defined by the appended claims.

What is claimed is:

1. A memory controller for use with an external tag RAM in a system having a processor coupled to an address bus and a data bus, said system including DRAM memory and cache SRAM memory coupled to a memory data bus coupled to said processor, said memory controller comprising:
   a plurality of tag data input/output lines for coupling to said external tag RAM;
   a plurality of address bus input lines for coupling to said address bus to provide addresses for comparison to addresses in said tag RAM;
   a comparator having first inputs coupled to said tag data input/output lines, second inputs coupled to said address bus input lines and an output for producing a hit/miss signal;
   an index data bus, coupled to said data bus, for providing tag test write data;
   a first multiplexer having first inputs coupled to said index data bus, second inputs coupled to said tag data input/output lines and an output for providing either said tag test write data or tag data from said tag RAM, and a select input for selecting between said first and second inputs;
   an index register having inputs coupled to said output of said first multiplexer for holding either said tag test write data or said tag data;
   a second multiplexer having first inputs coupled to said address bus input lines, second inputs coupled to the outputs of said index register and outputs coupled to said tag data input/output lines and a select input for selecting between said tag test write data and data from said address bus input lines;
   a DRAM state machine having a control input coupled to said comparator output for generating memory cycle timing signals for both said DRAM memory and said cache SRAM memory, including RAS and CAS signals for said DRAM memory only; and
   means for inhibiting said CAS signals during a test access of said cache SRAM memory to isolate said DRAM memory from said memory data bus during said test access.

2. A memory controller for use with an external tag RAM in a system having a processor coupled to an address bus and data bus, said memory controller comprising:
   a plurality of tag data input/output lines for coupling to said external tag RAM;
   a plurality of address bus input lines for coupling to said address bus to provide addresses for comparison to addresses in said tag RAM;
   a comparator having first inputs coupled to said tag data input/output lines, second inputs coupled to address bus input lines and an output for producing a hit/miss signal;
   an index data bus, coupled to data bus, for providing tag test write data;
   a first multiplexer having first inputs coupled to said index data bus, second inputs coupled to said tag data input/output lines and an output for providing either said tag test write data or tag data from said tag RAM, and a select input for selecting between said first and second inputs;
   an index register having inputs coupled to said output of said first multiplexer for holding either said tag test write data or said tag data;
   a second multiplexer having first inputs coupled to said address bus input lines, second inputs coupled to the outputs of said index register and outputs coupled to said tag data input/output lines and select input for selecting between said tag test write data and data from said address bus input lines;
   a CAS generation circuit for generating CAS signals, said CAS generation circuit having an enable input;
   means for storing a test window address range;
   means for comparing an address on said address bus to said test window address range and generating a test window hit signal at an output if said address is within said range;
   a programming input coupled to said means for comparing for determining which address bits of said address bus are to be compared in said means for comparing; and
   logic means, having a first input coupled to said output of said means for comparing and a second input coupled to a test mode enable line, for providing an output to said enable input of said CAS generation circuit when a test mode is enabled and an address is within said test window address range.

3. The memory controller of claim 2 wherein said programming input is connected to a programmable register.

4. A memory controller for use with an external tag RAM in a system having a processor coupled to an address bus and a data bus, said memory controller comprising:
   a plurality of tag data input/output lines for coupling to said external tag RAM;
   a plurality of address bus input lines for coupling to said address bus to provide addresses for comparison to addresses in said tag RAM;
   a comparator having first inputs coupled to said tag data input/output lines, second inputs coupled to said address bus input lines and an output for producing a hit/miss signal;

an index data bus, coupled to said data bus, for providing tag test write data;

a first multiplexer having first inputs coupled to said index data bus, second inputs coupled to said tag data input/output lines and an output for providing either said tag test write data or tag data from said tag RAM, and a select input for selecting between said first and second inputs;

an index register having inputs coupled to said output of said first multiplexer for holding either said tag test write data or said tag data;

a second multiplexer having first inputs coupled to said address bus input lines, second inputs coupled to the outputs of said index register and outputs coupled to said tag data input/output lines and a select input for selecting between said tag test write data and data from said address bus input lines;

a buffer coupled between an output of said index register and said index bus; and control means, coupled to said select input of said first multiplexer and an enable input of said buffer, for providing data from said tag data input/output lines to said index register in a first test cycle and providing data from said index register to said index bus in a second test cycle.

5. A memory controller for use with an external tag RAM in a system having a processor coupled to an address bus and a data bus, said memory controller comprising:

a plurality of tag data input/output lines for coupling to said external tag RAM;

a plurality of address bus input lines for coupling to said address bus to provide addresses for comparison to addresses in said tag RAM;

a comparator having first inputs coupled to said tag data input/output lines, second inputs coupled to said address bus input lines and an output for producing a hit/miss signal;

an index data bus, coupled to said data bus, for providing tag test write data;

a first multiplexer having first inputs coupled to said index data bus, second inputs coupled to said tag data input/output lines and an output for providing either said tag test write data or tag data from said tag RAM, and a select input for selecting between said first and second inputs;

an index register having inputs coupled to said output of said first multiplexer for holding either said tag test write data or said tag data;

a second multiplexer having first inputs coupled to said address bus input lines, second inputs coupled to the outputs of said index register and outputs coupled to said tag data input/output lines and a select input for selecting between said tag test write data and data from said address bus input lines; and control means, coupled to said select inputs of said first and second multiplexers, for providing data from said index bus to said index register in a first test cycle, and providing data from said index register to said tag data input/output lines in a second test cycle.

* * * * *